United States Patent [19]
Bredemann et al.

[11] Patent Number: 4,879,521
[45] Date of Patent: Nov. 7, 1989

[54] DIFFERENTIAL AMPLIFIER

[75] Inventors: Michael V. Bredemann, Rio Rancho, N. Mex.; Forest S. Seitz, Beaverton, Oreg.

[73] Assignee: Honeywell Inc., Minneapolis, Minn.

[21] Appl. No.: 299,909

[22] Filed: Jan. 23, 1989

[51] Int. Cl.[4] .............................................. H03F 3/45
[52] U.S. Cl. ...................................... 330/258; 330/69
[58] Field of Search .................................. 330/69, 258

[56] References Cited

U.S. PATENT DOCUMENTS 3,761,831  9/1973  Foerster .......................... 330/258 X
4,152,659  5/1979  Gordon ............................. 330/69 X

FOREIGN PATENT DOCUMENTS 203009 10/1985 Japan .................................... 330/258

Primary Examiner—James B. Mullins
Attorney, Agent, or Firm—Arnold L. Albin

[57] ABSTRACT

A circuit for a differential amplifier having common mode rejection means. The common mode voltage is applied to an inverting amplifier to derive a common mode signal in opposition to the applied common mode voltage. A portion of the applied common mode voltage is combined with the opposing common mode voltage in a ratio such that the resultant common mode signal has a null value. A voltage divider network coupled to the input of the amplifier provides an output corresponding to a differential signal and substantially independent of the common mode signal. Buffer amplifiers provide substantial isolation from stray capacitances and loading by the resistor elements, thereby enhancing the bandwidth of the circuit.

10 Claims, 2 Drawing Sheets

DIFFERENTIAL AMPLIFIER

This invention was made with U.S. Government support and the U.S. government has certain rights therein.

BACKGROUND OF THE INVENTION

1. Field of the Invention

The invention relates to differential amplifiers, and more particularly to a differential amplifier providing common mode rejection.

2. Description of the Prior Art

A prior art deflection amplifier system of interest with respect to the present invention is disclosed in the T. W. Spilsbury U.S. Pat. No. 4,302,708, "Deflection Amplifier System for Raster Scanned Cathode Ray Tube Displays", issued Nov. 24, 1981 and assigned to the assignee of the present invention. Spilsbury describes a deflection system including a differential input amplifier stage and a deflection amplifier system which drives the deflection coil of this display system. An error signal is applied to the differential amplifier that is fed forward to adjust the fly back pulse amplitude in a manner to reduce the error signal to zero and thereby provide the desired linear deflection yoke current. A sampling resistor is connected in series with the beam deflection coil to provide a negative feedback voltage proportional to coil current for use in promoting linear operation of this system. One end of the deflection yoke is connected to a capacitor, diode, and transistor connected in parallel, for operation in a cycle of resonant oscillation which occurs during the resonant retrace interval. The sampling resistor is connected in series with the other end of the beam deflection coil. Since the sampling resistor is connected to an ungrounded side of the deflection coil, it is subject to a substantial common mode beam deflection signal which is of a significantly greater amplitude than the desired differential signal used to provide the negative feedback signal. The common mode potential can lead to oscillation or overloading and saturation of the differential amplifier. It is therefore desirable to provide an improved differential amplifier which has substantial rejection to the common mode signal while providing amplification of the differential voltage.

SUMMARY OF THE INVENTION

A differential amplifier embodying the principles of the present invention comprises a summing network coupled to input terminals of the amplifier and to a common junction for producing a signal representative of the common mode signal, an inverting amplifier coupled to the summing network for producing a signal proportional to and in a phase opposing the common mode signal, and a second summing network coupled to the input terminals and to the junction of the first summing network for combining the common mode signal and the opposing common mode signal so as to produce a null value and to transmit at least a portion of the differential signal to output terminals coupled to a conventional differential amplifier.

DESCRIPTION OF THE PREFERRED EMBODIMENT

Any combination of input signals can be decomposed into differential and common mode input signals. The differential input voltage is defined as the difference between the two input signals, i.e., $$e_d = V_1 - V_2 \tag{1}$$

The common mode input voltage is defined as:

$$e_c = (V_1 + V_2)/2 \tag{2}$$

Thus there is a differential component in which the signals on the two input terminals are equal in magnitude and 180° out of phase and a common mode component in which the two input terminal signals are equal in magnitude and in phase. The ratio of differential gain to common mode gain is known as the common mode rejection ratio. The actual amplifier output to any input signal is the sum of a differential gain product and a common mode gain product. The common mode product introduces an error term. The larger the common mode rejection ratio the smaller the error term and the greater the amplifier accuracy.

Figure 1:
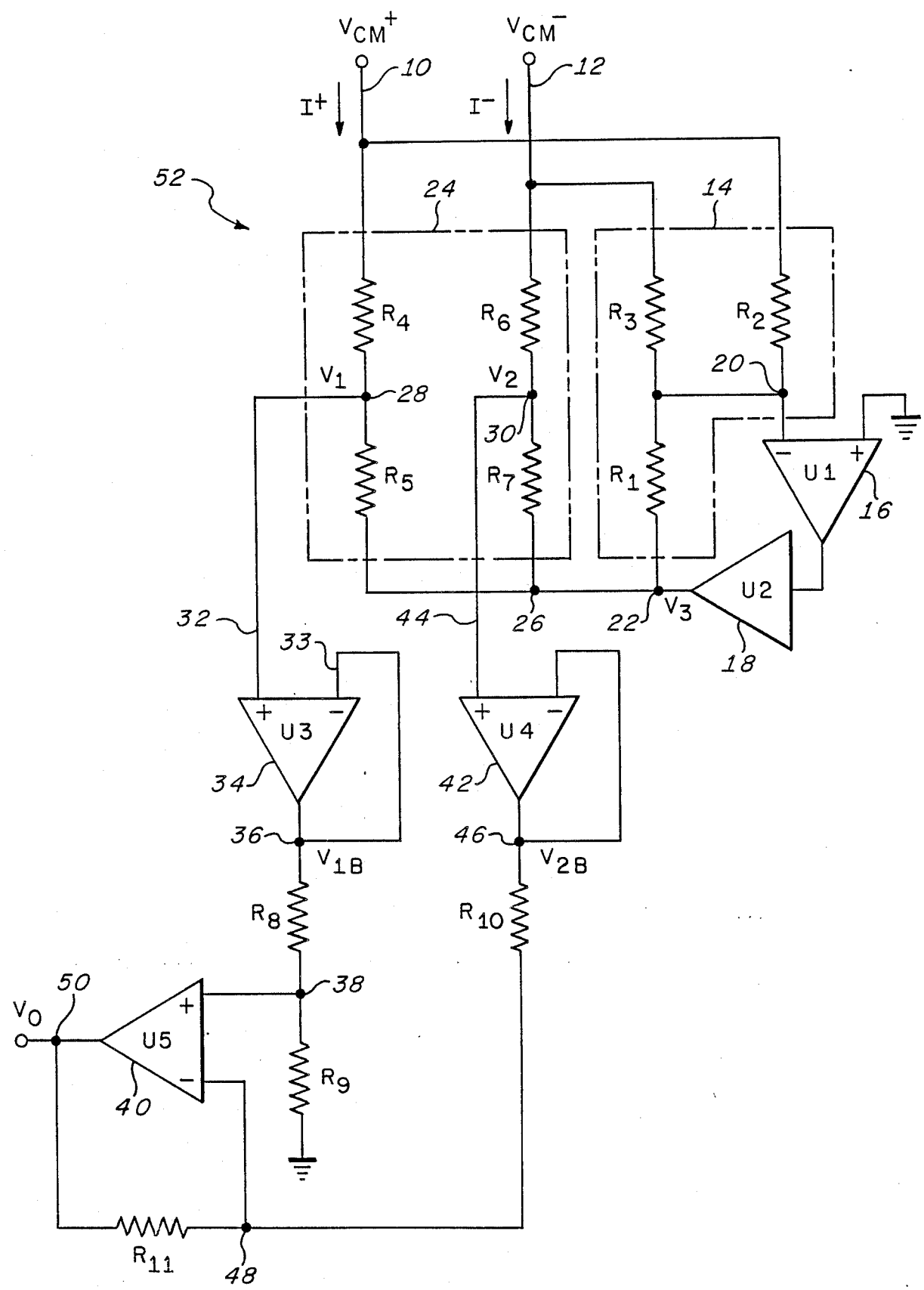
FIG. 1 is an electrical schematic drawing of a differential amplifier incorporating the common mode rejection features of the present invention.

Referring now to FIG. 1, the differential amplifier 52 is comprised of a common mode summing network 14, an inverting amplifier 16, and a buffer amplifier 18. The summing network 14 is comprised of resistors R2 and R3 which have their first ends connected to terminals 10 and 12 respectively and the common node 20 coupled to the inverting input of amplifier 16. The non-inverting input of amplifier 16 is coupled to ground. Node 20 is further connected to one end of a resister R1. The output of amplifier 16 is connected to the input of amplifier 18 whose output is further connected to resister R1 at node 22.

Terminals 10 and 12 are connected to a further summing network 24 which is comprised of two voltage dividers respectively coupled to the input terminals 10 and 12 at one end and to a node 26 which is connected to node 22 at the other end. The voltage dividers are comprised of series resistors R4 and R5, and R6 and R7, respectively. Divider R4, R5 is tapped at a junction 28 to provide an output voltage V1. Divider R6, R7 is tapped at a junction 30 to provide an output voltage V2. The output signal V1 is coupled via line 32 to a high impedance buffer amplifier 34 which in turn has an output coupled to a resistor network R8, R9 for providing an output signal V1B at node 36. Series resistors R8 and R9 are tapped at junction 38 to provide a signal to the non-inverting input of a differential amplifier 40 whose function is to be described. The inverting input 33 of amplifier 34 is coupled to its output at node 36 in a conventional manner. A second buffer amplifier 42 is coupled via lead 44 to node 30. In a similar manner, this amplifier feeds an output node 46 to develop a signal V2B and a resistive divider R10, R11. Junction 48 of R10, R11 is coupled to the inverting input of amplifier 40, and the free end of resistor R11 is connected to the output of amplifier 40 at node 50 to provide an output Vo.

In operation, an input signal having both differential and common mode signal components is applied to terminals 10 and 12. Vcm+ and Vcm− are the input signals containing the common mode voltage, Vcm, and the desired differential signal, S+ −S−. Thus, $$Vcm+ = Vcm + S+ \qquad (3)$$

$$Vcm- = Vcm + S- \qquad (4)$$

Resistors R1, R2 and R3 and amplifier 16 are configured as an inverting summing amplifier. Resistors R2 and R3 couple the signals at terminals 10 and 12 to provide a current sum thereof at terminal 20 which flows through resistor R1 to produce the output voltage V3 at node 22. The gain of the circuit encompassing amplifiers 16 and 18 is determined by the resistor ratios R1/R2 and R1/R3. Thus, provided R2 and R3 are equal in value, the voltage V3 developed at node 22 must be proportional to the negative of the average of the input signals Vcm+ and Vcm−, at terminals 10 and 12 respectively. Since the output of amplifier 16 is limited to + or −10V using typically available operational amplifiers, the gain of this circuit must be chosen so that U1 will operate within this range. This is obtained by choosing a value R1/R2=R1/R3=5/Vcmm, where Vcmm represents the maximum common mode voltage in units of volts applied to the input. Amplifier 18 serves as a unity gain current buffer for supplying the developed inverse common mode voltage to node 26 of summing network 24. The resistive elements of network 24 are chosen so that R4/R5=R6/R7=Vcmm/10. This insures that the value of the common mode voltage, which is developed at terminals 10 and 12 of the summing network 24 and the value of common mode voltage, which is developed at node 26 through summing network 14, and amplifiers 16 and 18 are proportional and opposing so that a null value occurs at junctions 28 and 30. Thus voltages V1 and V2 are substantially free of the influence of the common mode voltage and are representative of the differential voltage applied to terminals 10 and 12.

To assure a high common mode rejection ratio, R4/R5 must be quite accurately matched to the ratio of R6/R7. Amplifiers 34 and 42 are high impedance unity gain buffers which serve the purpose of isolating nodes 28 and 30 from being unequally loaded by the unequal currents flowing through resistors associated with amplifer U5. Current buffer U2 reduces the effects of stray capacitance associated with summing network 24 and increases the operational frequency range of the amplifier. Preferably, the circuit should be symetrically disposed in order to equalize stray capacitances about nodes 28 and 30 and thereby extend the frequency range over which the common mode rejection ratio is acceptable.

Resistors R8, R9, R10, and R11 are chosen to provide differential amplifier 40 with an appropriate gain factor to provide the desired amplification of the differential signal. Thus, R9/R8=R11/R10=($V_{cmm}$+10)/10.

In some applications it is important to consider the effect of the imbalance introduced by a current flow through a terminating resistor which may be applied at terminals 10 and 12 as in the deflection amplifier heretofore described. These currents are designated as I+ and I−.

Figure 2:
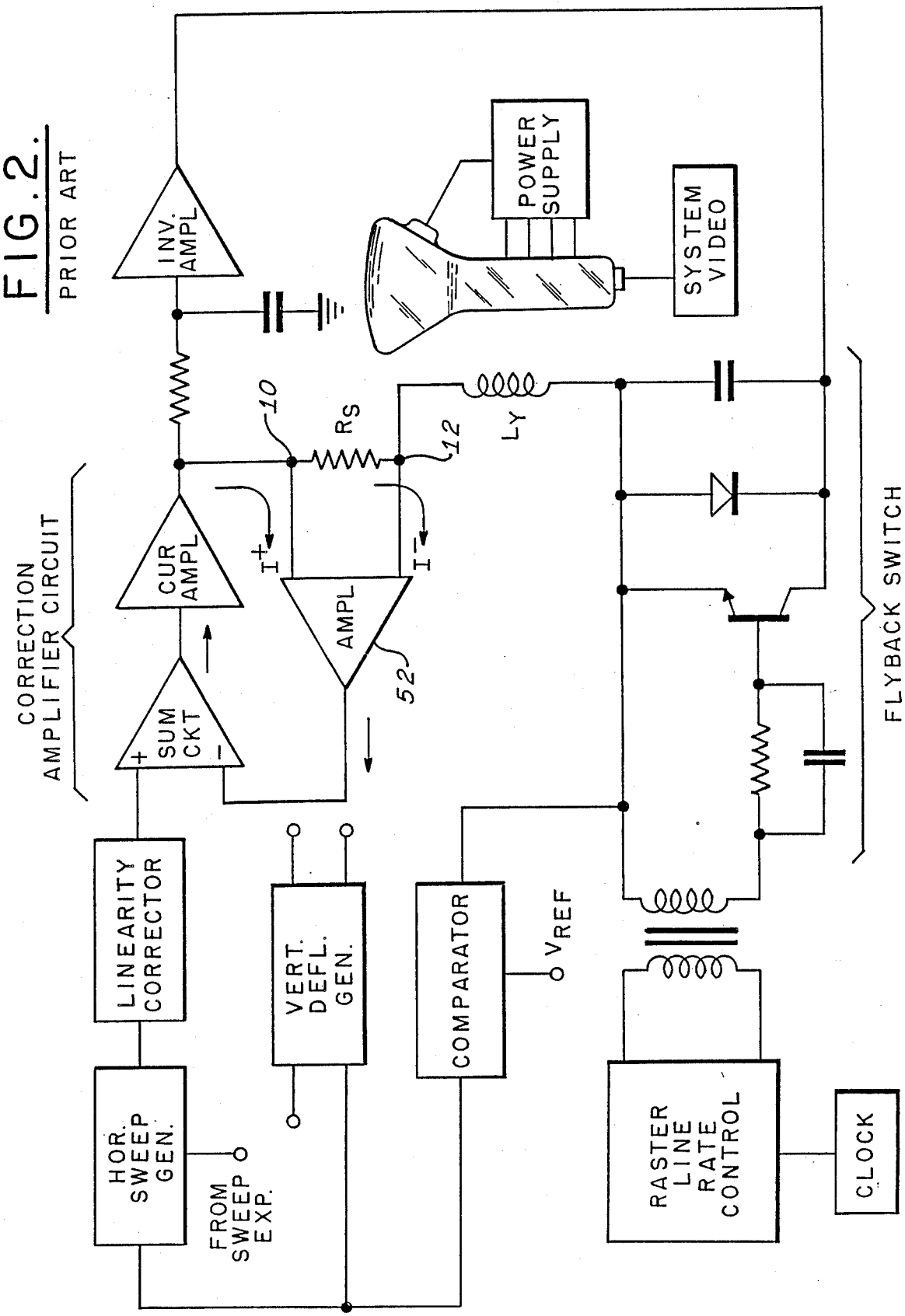
FIG. 2 is a block diagram of a prior art linear deflection amplifier in which the differential amplifier of the present invention may be incorporated.

Referring to FIG. 2 there is shown a block diagram of a typical linear deflection amplifier incorporating the differential amplifier 52 of the present invention and a resistor Rs in series with the deflection yoke Ly for sampling the current through the yoke. Note that current I+ does not flow through the resistor Rs, nor through the yoke Ly. Therefore, the current I+ does not contribute an error to the voltage across Rs. Current I− flows through node 10 and 12 and thus introduces an error into the differential voltage across Rs, since the resultant voltage drop is not representative of the current through the yoke Ly. With the resistors of summing junction 24 matched as described in connection with FIG. 1, this would result in a voltage difference between points V1 and V2 when a positive potential is applied to terminal 10, even though no current is flowing through the deflection yoke. By adjusting the ratios R4/R5 and R6/R7 to differ slightly so that the ratio R4/R5 is greater than the ratio R6/R7, the undesired current through the sample resistor may be compensated for. Thus, for example, assuming a figure for the maximum common mode voltage Vcmm=20V, and Rs=0.1 ohm, suitable values are R3=20K ohm
R5=R7=200 ohm
R4=400.051 ohm Similarly, for R7=200 ohm a suitable value for R6 is
R6=399.949 ohm.

Since R1/R2=R1/R3=5/Vcmm, it may be shown that R1=5K ohm and R2=20K ohm.

It may be seen from the above values that the required correction factors are extremely small and can only be achieved with highly stable resistance elements that are capable of being electronically trimmed, such as by laser. Thus the circuit is well adapted for use in a hybrid or monolithic chip, where the advantages of laser trimmed resistors makes its production feasible. Common mode rejection ratios of the order of −96 db have been measured in a test circuit.

While the invention has been described in its preferred embodiment, it is to be understood that the words which have been used are words of description rather than limitation and that changes may be made within the purview of the appended claims without departing from the true scope and spirit of the invention in its broader aspects.

Embodiments of an invention in which an exclusive property or right is claimed are defined as follows:

1. A differential amplifier for extracting a differential signal component in the presence of a substantially greater common mode signal, comprising:

first and second input terminals for receiving respective differential signal and common mode signal voltage components applied thereto, a first summing network having first and second impedance elements respectively coupled to said first and second terminals and to a common junction for producing a signal representative of said common mode signal, an amplifier having an input and an output, said input coupled to said first summing network for producing a signal proportional to and in a sense opposing said common mode signal, a second summing network comprising a plurality of further impedance elements having first and second nodes coupled respectively to said first and second input terminals and a third node coupled to said output of said amplifier for combining said common mode signal and said opposing signal so as to produce a null value thereof and to transmit at least a portion of said differential signal to a pair of output terminals coupled respectively to points intermediate of pairs of said plurality of impedance elements, differential gain means having a pair of input terminals for receiving said portion of said differential signal and providing an amplified output thereof substantially independent of said common mode signal, and impedance isolating means having an output coupled to said input terminals of said differential gain means and an input coupled to said intermediate points of said second summing network for isolating said second summing junction from an input impedance of said differential gain means.

2. A differential amplifier as set forth in claim 1 wherein said amplifier comprises:

an inverting amplifier having an inverting input, a non-inverting input, and an output, and a third impedance element having a first end coupled said to inverting input and a second end coupled to said third node of said second summing network.

3. A differential amplifier as set forth in claim 2, further comprising a unitary gain amplifier having an input coupled to said output of said inverting amplifier and an output coupled to said third node of said second summing network so as to interpose said unitary gain amplifier between said inverting amplifier and said third node.

4. A differential amplifier as set forth in claim 3 wherein:

said first and second impedance elements of said first summing network have substantially equal values of impedance, and said first and third impedance elements and said second and third impedance elements have a substantially equal value of a predetermined impedance ratio.

5. A differential amplifier as set forth in claim 4, wherein said second summing network comprises an impedance divider circuit, said further impedance elements comprised of a pair of voltage dividers each having a first end connected to one of said input terminals, a second end connected to said output of said unitary gain amplifier and said intermediate points coupled respectively to each of said further impedance elements such that a predetermined portion of the voltage difference applied between said first and second input terminals appears between each of said intermediate points.

6. A differential amplifier as set forth in claim 5, wherein said voltage dividers of said second summing network have equal ratios of voltage division.

7. A differential amplifier as set forth in claim 6, further comprising impedance element divider means coupled between said output of said impedance isolating means and said input of said differential gain means.

8. A differential amplifier as set forth in claim 7, wherein said impedance element divider means is comprised of a further pair of voltage dividers having equal and predetermined ratios of division.

9. A differential amplifier as set forth in claim 8, said impedance element divider means further comprising a first node coupled to a non-inverting input and a second node coupled to an inverting input of said differential gain means, said first node having a resistive element coupled to ground and said second node having a further resistive element coupled to said output of said differential gain means.

10. A method of suppressing a common mode voltage signal, comprising:

providing a pair of input terminals for receiving said common mode voltage, providing an inverting amplifier coupled to said input terminals for generating a signal representative of said common mode signal in a sense opposing said common mode signal, providing a voltage divider responsive to said common mode signal for generating an output corresponding to a portion of said common mode signal and for summing said portion of said common mode signal and said opposing portion of said common mode signal, coupling said voltage divider to a buffer amplifier for providing an output corresponding to a differential potential applied to said input terminals independent of said common mode voltage signal, and providing a differential gain for receiving a signal proportional to an output from said buffer amplifier for providing an amplified signal substantially free of said common mode signal.

* * * * *